United States Patent
Jiang et al.

(10) Patent No.: US 11,294,219 B2
(45) Date of Patent: Apr. 5, 2022

(54) QUANTUM DOT COLOR FILTER SUBSTRATE, DISPLAY PANEL AND DISPLAY DEVICE

(71) Applicant: Shanghai Tianma Micro-Electronics Co., Ltd., Shanghai (CN)

(72) Inventors: Yongli Jiang, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 168 days.

(21) Appl. No.: 16/599,133

(22) Filed: Oct. 11, 2019

(65) Prior Publication Data

US 2020/0041837 A1    Feb. 6, 2020

(30) Foreign Application Priority Data

Apr. 30, 2019   (CN) .......................... 201910360623.2

(51) Int. Cl.
| | |
|---|---|
| *G02F 1/1335* | (2006.01) |
| *G02F 1/13357* | (2006.01) |
| *H01L 51/50* | (2006.01) |
| *H01L 27/32* | (2006.01) |

(52) U.S. Cl.
CPC .. *G02F 1/133514* (2013.01); *G02F 1/133512* (2013.01); *G02F 1/133609* (2013.01); *H01L 51/502* (2013.01); *G02F 1/133614* (2021.01); *G02F 2201/52* (2013.01); *G09G 2300/0452* (2013.01); *H01L 27/3216* (2013.01)

(58) Field of Classification Search
None
See application file for complete search history.

(56) References Cited

FOREIGN PATENT DOCUMENTS

| CN | 103713415 A |   | 4/2014  |
|----|-------------|---|---------|
| CN | 106033767 A |   | 10/2016 |
| CN | 107229155 A | * | 10/2017 |
| CN | 107229155 A |   | 10/2017 |
| CN | 109085717 A | * | 12/2018 |

OTHER PUBLICATIONS

Office Action of CN Patent Application No. 201910360623.2 dated Jun. 22, 2021.

* cited by examiner

*Primary Examiner* — Thanh Nhan P Nguyen
(74) *Attorney, Agent, or Firm* — Kilpatrick Townsend & Stockton, LLP (57) ABSTRACT

A quantum dot color filter substrate, a display panel, and a display device are provided. The quantum dot color filter substrate includes a plurality of pixel units arranged in an array. The pixel unit includes a blue sub-pixel, a red sub-pixel, and a green sub-pixel. The red sub-pixel includes a red quantum dot color filter. The green sub-pixel includes a green quantum dot color filter. An area ratio of the blue sub-pixel, the red sub-pixel, and the green sub-pixel is 1:X:Y, and $2.5 \leq X \leq 5$, $4 \leq Y \leq 6$. The quantum dot color filter substrate is used for cooperating with a blue backlight, and for compensating the difference in the conversion efficiency of the blue dot color filter with different colors for the blue light, and improving the color shift phenomenon caused by the difference in the conversion efficiency of the blue dot color filter with different colors to blue light.

17 Claims, 5 Drawing Sheets

QUANTUM DOT COLOR FILTER SUBSTRATE, DISPLAY PANEL AND DISPLAY DEVICE

CROSS-REFERENCE TO RELATED APPLICATIONS

The present application claims priority to Chinese Patent Application No. 201910360623.2, filed on Apr. 30, 2019, the content of which is incorporated herein by reference in its entirety.

FIELD

The present disclosure relates to the field of display technologies, and particularly, to a quantum dot color filter substrate, a display panel, and a display device.

BACKGROUND

Quantum dots, also known as nano-crystals, are nanoparticles composed of Group II-VI or Group III-V elements. Quantum dots generally have a particle size between a few nanometers and tens of nanometers. Due to the presence of the quantum confinement effect, an original continuous band structure of a quantum dot material becomes a discrete energy level structure, which can emit visible light after being excited. Moreover, the quantum dot material has advantages of concentrated luminescence spectrum, high color purity, and continuously adjustable luminescence spectrum. With the above advantages, applying the quantum dot material to a display device can effectively improve a color gamut and color reproduction capability of the display device.

A display panel based on quantum dot technology uses blue light to excite quantum dots in a quantum dot film layer to generate light of different colors during displaying. However, since the quantum dot film layer for generating red light and green light has limited conversion efficiency to blue light, it is possible to cause a color shift phenomenon on a displayed image.

SUMMARY

In view of this, the present disclosure provides a quantum dot color filter substrate, a display panel, and a display device, in order to improve color shift phenomenon of a display screen.

One embodiment of the present disclosure, a quantum dot color filter substrate for use with a blue backlight is provided. The quantum dot color filter substrate includes a plurality of pixel units arranged in an array. The plurality of pixel units each comprises a blue sub-pixel, a red sub-pixel and a green sub-pixel, the red sub-pixel comprising a red quantum dot color filter, and the green sub-pixel comprising a green quantum dot color filter. An area ratio of the blue sub-pixel, the red sub-pixel, and the green sub-pixel is 1:X:Y, where $2.5 \leq X \leq 5$ and $4 \leq Y \leq 6$.

Another embodiment of the present disclosure, a display panel is provided. The display panel includes the above quantum dot color filter substrate and a blue backlight located at a light-emitting side of the blue backlight.

In yet another embodiment of the present disclosure, a display device is provided. The display device includes the above display panel.

In embodiments of the present disclosure, an area ratio of the blue sub-pixel B, the red sub-pixel R, and the green sub-pixel G is set to 1:X:Y, and $2.5 \leq X \leq 5$, $4 \leq Y \leq 6$, that is, the area of the blue sub-pixel B is set to the minimum, the area of the green sub-pixel G is set to the maximum, and the area of the red sub-pixel R is set as between the blue sub-pixel B and the green sub-pixel G, so that the difference in the conversion efficiency of the blue dot color filter with different colors for the blue light can be compensated, thereby solving the color shift phenomenon caused by the difference in the conversion efficiency of the blue dot color filter with different colors for blue light.

BRIEF DESCRIPTION OF DRAWINGS

In order to better explain the embodiments of the present disclosure, the drawings to be used in the description of the embodiments or the related art will be briefly described below. It is appreciated that, the drawings in the following description only show some embodiments of the present disclosure.

DESCRIPTION OF EMBODIMENTS

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless noted otherwise.

It should be understood that although the terms 'first', 'second' and 'third' may be used in the present disclosure to describe sides, these sides should not be limited to these terms. These terms are used only to distinguish the sides from each other. For example, without departing from the scope of the embodiments of the present disclosure, a first side may also be referred to as a second side. Similarly, the second side may also be referred to as the first side.

Figure 1:
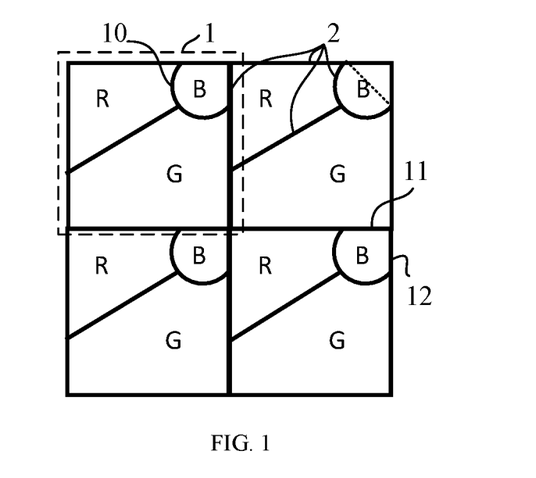
FIG. 1 is a schematic diagram of a quantum dot color filter substrate according to an embodiment of the present disclosure.
Figure 2:
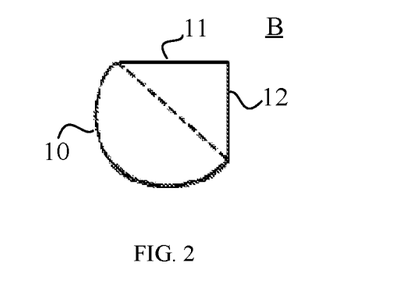
FIG. 2 is a schematic view of a blue sub-pixel in FIG. 1.

The present disclosure provides a quantum dot color filter substrate for cooperating with a blue backlight. FIG. 1 is a schematic diagram of a quantum dot color filter substrate according to an embodiment of the present disclosure; and FIG. 2 is a schematic view of a blue sub-pixel in FIG. 1. As shown in FIGS. 1 and 2, the quantum dot color filter substrate includes a plurality of pixel units 1 arranged in an array. The pixel unit 1 includes a blue sub-pixel B, a red sub-pixel R, and a green sub-pixel G. The red sub-pixel R includes a red quantum dot color filter, and the green sub-pixel G includes a green quantum dot color filter. An area ratio of the blue sub-pixel B, the red sub-pixel R, and the green sub-pixel G is 1:X:Y, and $2.5 \leq X \leq 5$, $4 \leq Y \leq 6$.

When the quantum dot color filter substrate is cooperated with a blue backlight, blue light emitted by the blue backlight is emitted through the red quantum dot color filter included in the red sub-pixel R, and is converted by the red quantum dot color filter into red light, so that the red sub-pixel R emits red light. Blue light emitted by the blue backlight is emitted through the green quantum dot color filter included in the green sub-pixel G, and is converted by the green quantum dot color filter into green light, so that the green sub-pixel G emits green light. Blue light emitted by the blue backlight passes through the blue sub-pixel B, so that the blue sub-pixel B emits blue light, thereby realizing the color light transmission of the quantum dot color filter substrate.

Since the conversion efficiency of the blue dot color filter material corresponding to different colors is different for blue light, and blue light can be directly emitted from a region where the blue sub-pixel B is located, there is almost no loss. Therefore, in the embodiments of the present disclosure, by adjusting the area occupied by the sub-pixels with three colors, i.e., an area ratio of the blue sub-pixel B, the red sub-pixel R, and the green sub-pixel G is set to 1:X:Y, and $2.5 \leq X \leq 5$, $4 \leq Y \leq 6$, that is, the area of the blue sub-pixel B is set to the minimum, the area of the green sub-pixel G is set to the maximum, and the area of the red sub-pixel R is set as between the blue sub-pixel B and the green sub-pixel G, so that the difference in the conversion efficiency of the blue dot color filter with different colors for the blue light can be compensated, thereby solving the color shift phenomenon caused by the difference in the conversion efficiency of the blue dot color filter with different colors for blue light.

In an embodiment of the present disclosure, a transparent film layer may be or may not be arranged in the blue sub-pixel B, both of which can cause the emitted light to be still blue after the blue backlight passes through a position corresponding to the blue sub-pixel B.

Exemplarily, as shown in FIG. 1, black lines located between sub-pixels of different colors represent a black matrix 2 having a certain width. In an embodiment of the present disclosure, the black matrix 2 is arranged in the quantum dot color filter substrate, and the black matrix 2 is arranged around the blue sub-pixel B, the red sub-pixel R, and the green sub-pixel G, respectively, thereby avoiding crosstalk between light of different colors emitted from the sub-pixels with different colors.

It should be noted that line width of the black line representing the black matrix 2 between the adjacent two sub-pixels of different colors in FIG. 1 is only illustrative. In an actual design of the quantum dot color filter substrate, the width of the black matrix 2 can be adjusted accordingly according to different design requirements.

It should be noted that the number of pixel unit in FIG. 1 is only illustrative. In practical applications, the number of pixel unit can be set according to design requirements.

Exemplarily, in an embodiment of the present disclosure, during the shape design of the sub-pixel, the perimeter-to-area ratios (i.e., ratios of the perimeter to the area of the sub-pixels) of the blue sub-pixel B, the red sub-pixel R, and the green sub-pixel G can be designed to be relatively small. In this way, for any one of the sub-pixels, in the case where the area thereof is constant, the perimeter thereof can be reduced by reducing the perimeter-to-area ratio, so that when the black matrix is arranged around the sub-pixel, the perimeter of the black matrix arranged around the sub-pixel can also be designed to be smaller. In order to ensure the display effect, the width of the black matrix generally has a minimum value. Therefore, by reducing the perimeter of the black matrix in this way, the area occupied by the black matrix can be reduced correspondingly in the case where the area of the pixel unit is constant. Correspondingly, the light-emitting area of the sub-pixels can be increased, so that more areas in the display panel can be used to arrange the sub-pixels that can emit light, thereby increasing the number of pixels per inch (Pixels Per Inch, hereinafter referred to as PPI) in the display panel.

Further, in an embodiment of the present disclosure, the perimeter-to-area ratio of the blue sub-pixel B is set to be smaller than that of the red sub-pixel R, and is set to be smaller than that of the green sub-pixel G. That is, in this embodiment of the present disclosure, among the blue sub-pixel B, the red sub-pixel R, and the green sub-pixel G, the perimeter-to-area ratio of the blue sub-pixel B with the smallest area is set to the smallest compared with the perimeter-to-area ratio of the red sub-pixel R or the green sub-pixel G having a larger area, which can further reduce the area of the black matrix, and is more advantageous for the high PPI design of the display panel.

Exemplarily, as shown in FIGS. 1 and 2, a shape of the above-described blue sub-pixel B includes at least one arc 10 protruding in a direction facing away from a center of the blue sub-pixel B. Compared with other shapes such as designing a side of the blue sub-pixel B as a straight line or an arc protruding toward the center of the blue sub-pixel B, with the arrangement of the present disclosure, the perimeter of the blue sub-pixel B can be reduced under a same area, that is, the perimeter-to-area ratio of the blue sub-pixel is reduced, which is advantageous for achieving a high PPI design of the display panel.

Figure 3:
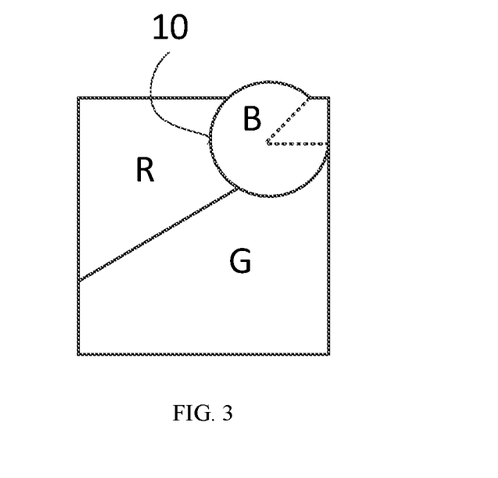
FIG. 3 is a schematic diagram of a pixel unit formed of three sub-pixels of red, green and blue when an angle of an arc is $\theta > 270°$.

As shown in FIGS. 1 and 2, an angle θ of the arc 10 satisfies $0 < \theta \leq 270°$. The angle θ of the arc 10 corresponds to the angle of a central angle corresponding to the arc 10. FIG. 3 is a schematic diagram of a pixel unit formed of three sub-pixels of red, green and blue when an angle of an arc is $\theta > 270°$. Compared to the case shown in FIG. 3, the present disclosure sets the angle θ of the arc 10 to be $0 < \theta \leq 270°$, so that the shape of the pixel unit 1 composed of the blue sub-pixel B, the red sub-pixel R, and the green sub-pixel G can be made more regular. Therefore, the pixel units 1 can overspread the display panel as much as possible, thereby improving space utilization of the display panel. As can be seen from FIG. 3, an outer contour of the pixel unit at this time is an irregular pattern formed by an arc and a straight line. When each of the plurality of pixel units is designed as the shape shown in FIG. 3, and when the display panel is designed as a regular pattern such as a rectangle, there will be an area in the display panel that cannot be covered by the pixel unit 1. That is, the pixel units 1 cannot overspread the entire display panel.

Figure 4:
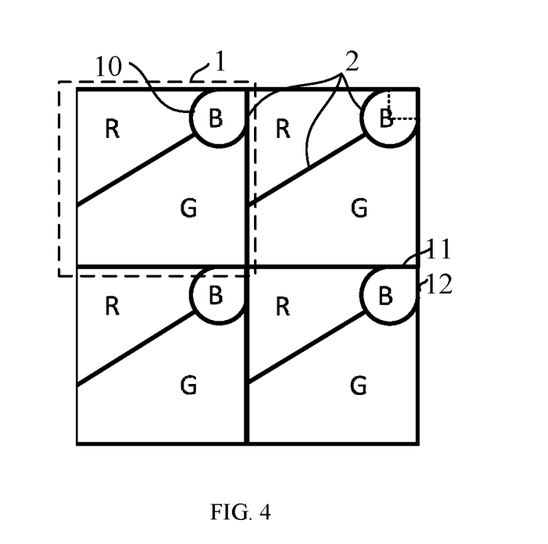
FIG. 4 is a schematic diagram of a quantum dot color filter substrate according to another embodiment of the present disclosure.

Exemplarily, the angle θ of the above arc 10 may be 180° as shown in FIG. 1. FIG. 4 is a schematic diagram of a quantum dot color filter substrate according to another embodiment of the present disclosure. Alternatively, as shown in FIG. 4, the angle of θ of the arc 10 may also be 270°, which may also enable the shape of the pixel unit 1 composed of the pixel B, the red sub-pixel R, and the green sub-pixel G to be regular, thereby facilitating the pixel units 1 to overspread the display panel.

Figure 5:
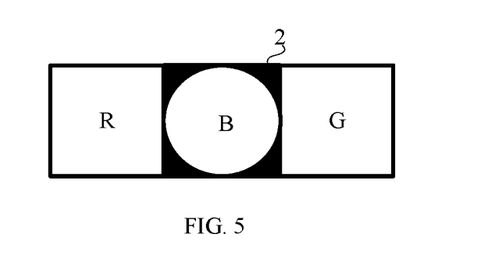
FIG. 5 is a schematic diagram of a pixel unit when a blue sub-pixel is circular, and each of a red sub-pixel and a green sub-pixel is square.
Figure 6:
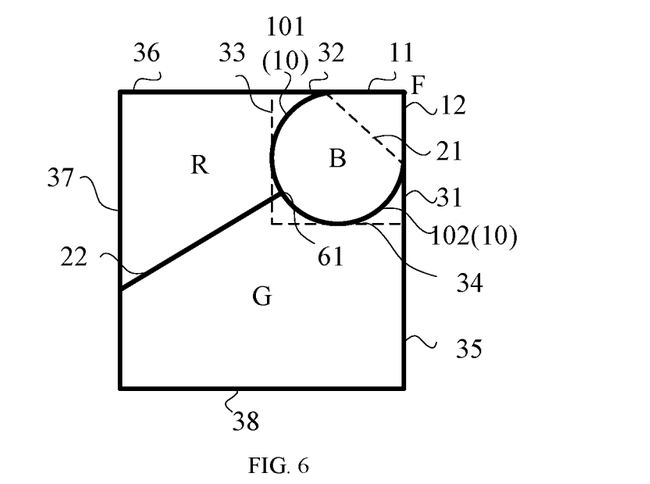
FIG. 6 is an enlarged schematic diagram of a pixel unit in FIG. 4.

In a shape design process of the blue sub-pixel B, the perimeter of the blue sub-pixel B is the smallest when the blue sub-pixel B is designed to be circular under a same area. However, when the blue sub-pixel B is designed to be circular, the space between the blue sub-pixel B and the adjacent sub-pixels will be large. FIG. 5 is a schematic diagram of a pixel unit 1 when a blue sub-pixel B is circular, and a red sub-pixel R and a green sub-pixel G are square. As shown in FIG. 5, there are many gaps between the blue sub-pixel B and the adjacent red sub-pixel R and green sub-pixel G, so that a close arrangement of the sub-pixels cannot be realized. Moreover, in order not to affect the display, the black matrix 2 is may need to be arranged at the gap, which is disadvantageous for the high PPI design of the display panel. FIG. 6 is an enlarged schematic diagram of a pixel unit in FIG. 4. As shown in FIG. 6, the present disclosure designs the shape of the blue sub-pixel B to include two line segments (line segment 11 and line segment 12 as shown in FIG. 2, FIG. 4, and FIG. 6), in which one of endpoints of one line segment is connected to one of endpoints of the other line segment, and the other two endpoints of the two line segments are respectively connected to two endpoints of the arc 10. That is, the shape of the blue sub-pixel B is designed as a pattern enclosed by two line segments and at least one arc to give consideration to the perimeter-to-area ratio of the remaining sub-pixels including the red sub-pixel R and the green sub-pixel G adjacent to the blue sub-pixel B. Therefore, the perimeter-to-area ratio of the sub-pixels adjacent to the blue sub-pixel B is not excessively large, and the close arrangement can be ensured between the blue sub-pixel B and the sub-pixels adjacent thereto.

Exemplarily, the shape of the blue sub-pixel B enclosed by the arc 10 and the two line segments may be a pattern formed by splicing a half circle and a triangle as shown in FIG. 1. Alternatively, the shape of the blue sub-pixel B enclosed by the arc 10 and the two line segments may also be a pattern formed by splicing a ¾ circle and a triangle as shown in FIG. 4.

In the shape design process of the blue sub-pixel B, as described above, on the basis of making the shape of the blue sub-pixel B include two line segments and at least one arc, taking a length of the first line segment (i.e., the line segment between the two endpoints of the arc) to be a constant value n as an example, when both sides of the first line segment are set as interconnected line segments, that is, when the shape of the blue sub-pixel B is designed as a square, and a length of the diagonal of the square line is n, the perimeter of the square is $C1 = 2\sqrt{2}n$, the area is $$S1 = \frac{n^2}{2},$$

and the perimeter-to-area ratio of the square can be calculated to be $$\frac{4\sqrt{2}}{n}.$$

When one side of the first line segment is arranged with a 270° arc, and the other side is arranged with two line segments having an equal length, that is, when the shape of the blue sub-pixel B is designed as a pattern by splicing a ¾ circle and a triangle as shown in FIGS. 4 and 6, the perimeter of the pattern is $$C2 = \sqrt{2}n + \frac{3\sqrt{2}\pi n}{4},$$

the area is $$S2 = \frac{n^2}{2} + \frac{3\pi n^2}{8},$$

and the perimeter-to-area ratio of the square can be calculated to be $$\frac{8\sqrt{2} + 6\sqrt{2}\pi}{4n + 3\pi n}.$$

Therefore, the present disclosure sets the perimeter-to-area ratio N of the blue sub-pixel B to satisfy $$\frac{8\sqrt{2} + 6\sqrt{2}\pi}{4n + 3\pi n} \leq N < \frac{4\sqrt{2}}{n},$$

in which n is a length of the first line segment. As shown in FIG. 6, the two endpoints of the arc 10 are the two endpoints of the line segment 21, that is, the first line segment 21 is a line segment connecting the two endpoints of the arc 10, so that the perimeter-to-area ratio of the sub-pixel adjacent to the blue sub-pixel B is not excessively large, thereby ensuring a dense arrangement of the blue sub-pixel B and its adjacent sub-pixels.

Exemplarily, the present disclosure can set the aspect ratio P of the minimum circumscribed rectangle of the blue sub-pixel B to be 1≤P≤2, so as to avoid a too narrow shape of the blue sub-pixel B, thereby improving the perimeter-to-area ratio of the blue sub-pixel B. As shown in FIG. 6, the minimum circumscribed rectangle of the blue sub-pixel B includes a first side 31, a second side 32, a third side 33, and a fourth side 34 that are connected head to tail. The two line segments included in the blue sub-pixel B coincide with the first side 31 and the second side 32, respectively. The intersection point of the two line segments coincides with the intersection point between the first side 31 and the second side 32, which is the intersection F in FIG. 3. The length of each of the two line segments is respectively less than or equal to the length of each of the first side 31 and the second side 32. Each of the third side 33 and the fourth side 34 is tangent to the arc 10 included in the blue sub-pixel B.

Exemplarily, as shown in FIG. 6, the shape of the pixel unit 1 includes a rectangle, so that the process difficulty of the pixel units 1 overspreading the display area of the display panel can be reduced when a display panel having a regular shape such as a rectangle is fabricated, thereby facilitating the high PPI design of the display panel.

As shown in FIG. 6, the rectangle includes a fifth side 35, a sixth side 36, a seventh side 37, and an eighth side 38 which are connected head to tail. The two line segments included in the blue sub-pixel B coincides with the fifth side 35 and the sixth side 36, respectively. An intersection point of the two line segments coincides with an intersection point between the fifth side 35 and the sixth side 36, which is the intersection point F in FIG. 6. A length of each of the two line segments is less than or equal to a length of each of the fifth side 35 and the sixth side 36.

In an embodiment, an aspect ratio Q of the rectangle formed by the pixel unit 1 satisfies 1≤Q≤1.5 so as to minimize the perimeter-to-area ratio of the pixel unit 1 to the greatest extent.

Exemplarily, as shown in FIG. 6, a boundary between the red sub-pixel R and the green sub-pixel G is a second line segment 22. One end of the second line segment 22 intersects with the seventh side 37, the other end of the second line segment 22 intersects with the arc 10. An intersection point between the second line segment 22 and the arc 10 is a first intersection point 61 which is a point of the arc 10 other than the endpoints of the arc 10. If the boundary between the red sub-pixel R and the green sub-pixel G is set as an arc that protrudes toward the red sub-pixel, the perimeter-to-area ratio of the red sub-pixel R will become large. Therefore, on the basis of ensuring reduction of the perimeter-to-area ratio of the blue sub-pixel B, the present disclosure sets the boundary between the red sub-pixel R and the green sub-pixel G to be a straight line, compared with a scheme of setting it as an arc, the perimeter-to-area ratio of the red sub-pixel R and the green sub-pixel G can be made not excessively large.

Moreover, as shown in FIG. 6, the present disclosure sets the arc 101 between the first intersection point 61 and one of the endpoints of the arc 10 to be the boundary between the red sub-pixel R and the blue sub-pixel B, and sets the arc 102 between the intersection 61 and the other endpoint of the arc 10 to be the boundary between the green sub-pixel G and the blue sub-pixel B. That is to say, each of the red sub-pixel R and the green sub-pixel G includes a short concave edge, avoiding one of the sub-pixels being designed with a long concave edge. Therefore, on the basis of ensuring a reduction of the perimeter-to-area ratio of the blue sub-pixel B and the close arrangement of the various sub-pixels, the perimeter-to-area ratios of the red sub-pixel R and the green sub-pixel G are not excessively increased.

Figure 7:
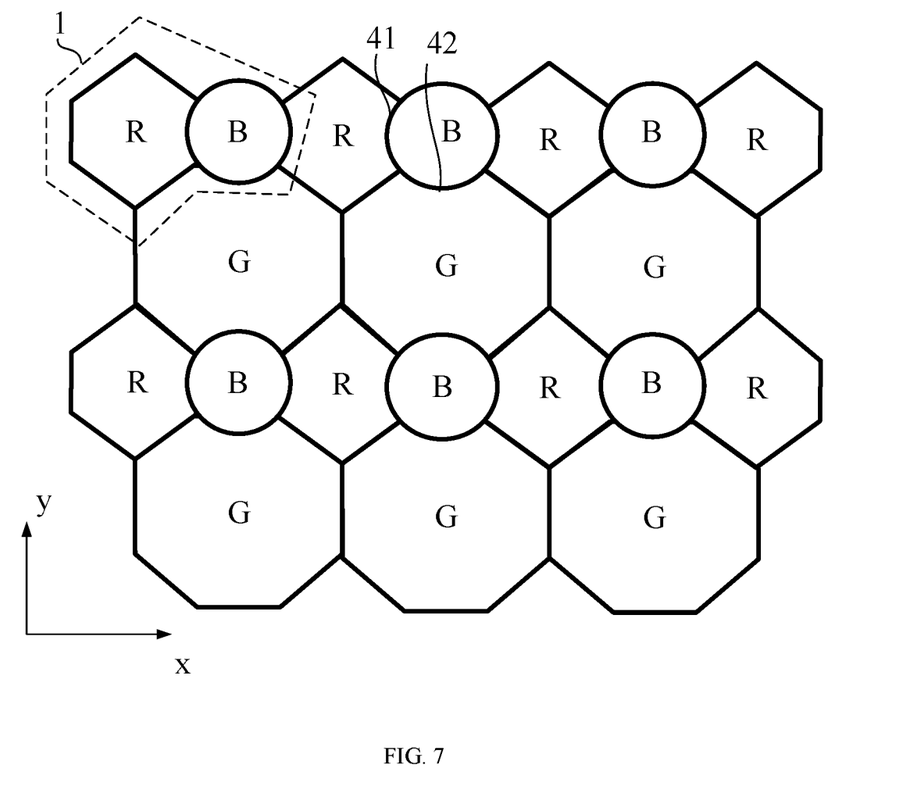
FIG. 7 is a schematic diagram of a quantum dot color filter substrate according to still another embodiment of the present disclosure.

FIG. 7 is a schematic diagram of a quantum dot color filter substrate according to still another embodiment of the present disclosure. Exemplarily, as shown in FIG. 7, the shape of the blue sub-pixel B is circular or elliptical so as to set the perimeter-to-area ratio of the blue sub-pixel B to be the minimum.

The boundary between the red sub-pixel R and the blue sub-pixel B is an arc 41 in the shape of the blue sub-pixel B, and the boundary between the green sub-pixel G and the blue sub-pixel B is another arc 42 in the shape of the blue sub-pixel B, so that a close arrangement can be achieved between the various sub-pixels.

Referring to FIG. 7 again, the red sub-pixel R and the blue sub-pixel B are alternately arranged along a first direction x, and the blue sub-pixel B and the green sub-pixel G are alternately arranged along a second direction y intersecting with the first direction x. Taking this arrangement, the centers of the red sub-pixel R, the green sub-pixel G, and the blue sub-pixel B are set to be non-collinear so as to improve the color mixing effect of the light emitted from the red sub-pixel R, the green sub-pixel G, and the blue sub-pixel B.

Exemplarily, as shown in FIG. 7, each of the shapes of the red sub-pixel R and the green sub-pixel G is polygonal, and the number of sides of the green sub-pixel G is larger than the number of sides of the red sub-pixel R, so that the perimeter-to-area ratio of the green sub-pixel G is smaller than that of the red sub-pixel R.

Figure 8:
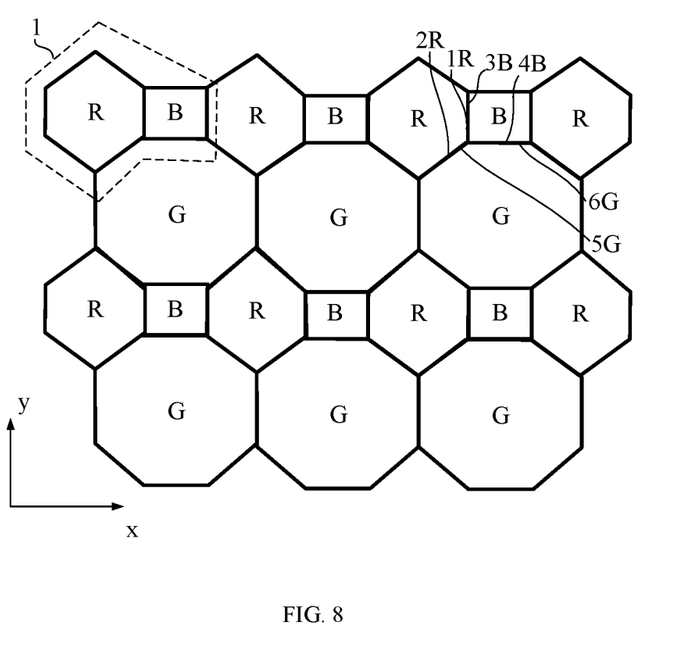
FIG. 8 is a schematic diagram of a quantum dot color filter panel according to yet another embodiment of the present disclosure.

Exemplarily, FIG. 8 is a schematic diagram of a quantum dot color filter panel according to yet another embodiment of the present disclosure. As shown in FIG. 8, the shape of the red sub-pixel R is hexagonal, the shape of the green sub-pixel G is octagonal, and the shape of the blue sub-pixel B is quadrangular. Therefore, on the base of ensuring the area of the red sub-pixel G to be larger than that of the red sub-pixel R, and the area of the red sub-pixel R to be larger than that of the blue sub-pixel B, each of the perimeter-to-area ratios of the sub-pixels including the red sub-pixel R, the blue sub-pixel B, and the green sub-pixel G is relatively small.

In an embodiment, as shown in FIG. 8, the red sub-pixel R and the blue sub-pixel B are alternately arranged along a first direction x, and the blue sub-pixel B and the green sub-pixel G are alternately arranged along a second direction y intersecting with the first direction x. Taking this arrangement, the centers of the red sub-pixel R, the green sub-pixel G, and the blue sub-pixel B are set to be non-collinear so as to improve the color mixing effect of the light emitted from the red sub-pixel R, the green sub-pixel G, and the blue sub-pixel B.

Referring to FIG. 8 again, the red sub-pixel R includes a first sub-side 1R and a second sub-side 2R adjacent to each other. The blue sub-pixel B includes a third sub-side 3B and a fourth sub-side 4B adjacent to each other. The green sub-pixel G includes a fifth sub-side 5G and the sixth sub-side 6G adjacent to each other. The first sub-side 1R is parallel to the third sub-side 3B. The second sub-side 2R is parallel to the fifth sub-side 5G. The fourth sub-side 4B is parallel to the sixth sub-side 6G. In such an arrangement according to an embodiment of the present disclosure, the red sub-pixel R, the blue sub-pixel B and the green sub-pixel G can be closely arranged, and the space between adjacent sub-pixels is reduced as much as possible, thereby facilitating the high PPI design of the display panel.

Figure 9:
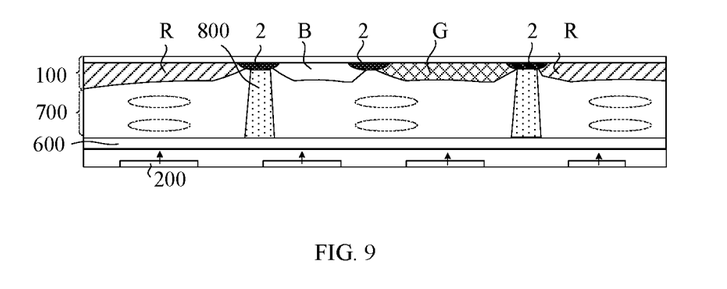
FIG. 9 is a cross-sectional schematic view of a liquid crystal display panel according to an embodiment of the present disclosure.

The present disclosure further provides a display panel. The display panel includes the above quantum dot color filter substrate. Exemplarily, the display panel may be a liquid crystal display panel. FIG. 9 is a cross-sectional schematic view of a liquid crystal display panel according to an embodiment of the present disclosure. As shown in FIG. 9, the liquid crystal display panel includes: the above quantum dot color filter substrate 100, an array substrate 600 arranged opposite to the quantum dot color filter substrate 100, a liquid crystal layer 700 between the quantum dot color filter substrate 100 and the array substrate 600, and a backlight module. The above blue backlight 200 can be arranged in the backlight module. The quantum dot color filter substrate 100 is located at the light-emitting side of the blue backlight 200. For example, the blue backlight 200 can be a LED light emitting blue light.

Exemplarily, the array substrate 600 may be provided with a pixel electrode (not shown) and a common electrode. Alternatively, the common electrode may be arranged on the above-mentioned quantum dot color filter substrate 100, which is not limited in the embodiments of the present disclosure.

In an embodiment, as shown in FIG. 9, the liquid crystal display panel further includes a support post 800 between the quantum dot color filter substrate 100 and the array substrate 600. The support post 800 is configured to maintain a cell thickness of the liquid crystal display panel.

When the liquid crystal display panel displays, the blue backlight 200 emits blue light. Under the action of an electric field formed by the pixel electrode and the common electrode, the liquid crystal molecules in the liquid crystal layer 700 are correspondingly deflected, thereby changing the intensity of the blue light emitted from the liquid crystal layer 700. After the blue light emitting from the blue backlight 200 is radiated to a quantum dot color filter substrate 100, and emitted out of the red quantum dot color filter included in the red sub-pixel R. The red quantum dot color filter converts blue light into red light, so that the red sub-pixel R emits red light. After the blue light is emitted out of the green quantum dot color filter included in the green sub-pixel G, the green quantum dot color filter converts blue light into green light, so that the green sub-pixel G emits green light. After the blue light is directly emitted out of the blue sub-pixel B, the blue sub-pixel B emits blue light. Therefore, color light transmission of the liquid crystal display panel can be achieved.

The structure of the quantum dot color filter substrate 100 has been described in detail in the above embodiments, which is not elaborated here.

It should be noted that the position of the backlight module shown in FIG. 9 is only illustrative. In fact, the backlight module may be a side light type backlight module or a straight down type backlight module.

Figure 10:
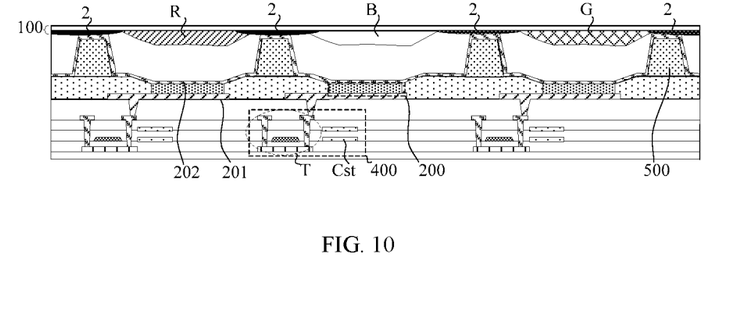
FIG. 10 is a schematic cross-sectional view of an organic light emitting display panel according to an embodiment of the present disclosure.

FIG. 10 is a schematic cross-sectional view of an organic light emitting display panel according to an embodiment of the present disclosure. As shown in FIG. 10, the organic light emitting display panel includes the quantum dot color filter substrate 100 and the blue backlight 200. Here, the blue backlight 200 may be formed of an organic light-emitting layer emitting blue light. Exemplarily, as shown in FIG. 10, an anode 201 and a cathode 202 are arranged on both sides of the blue light-emitting layer. When the organic light-emitting display panel displays, the anode 201 and the cathode 202 receive a voltage signal. Under the action of the voltage difference between the anode 201 and the cathode 202, the organic light-emitting layer emits blue light. The blue light is radiated to the quantum dot color filter substrate 100, and then is emitted out of the red quantum dot color filter included in the red sub-pixel R. The red quantum dot color filter converts blue light into red light, so that the red sub-pixel R emits red light. After the blue light is emitted out of the green quantum dot color filter included in the green sub-pixel G, the green quantum dot color filter converts blue light into green color, so that the green sub-pixel G emits green light. After the blue light is directly emitted out of the blue sub-pixel B, so that the blue sub-pixel B emits blue light. Therefore, color light transmission of the organic light-emitting display panel is achieved.

Exemplarily, as shown in FIG. 10, the organic light emitting display panel further includes a pixel circuit 400. The pixel circuit 400 includes a thin film transistor T and a storage capacitor Cst. The anode 201 is connected to the drain electrode of the corresponding thin film transistor T through a though hole. It should be noted that, FIG. 10 only illustratively shows the storage capacitor Cst in the pixel circuit and one thin film transistor T directly connected to the anode 201. The layer structure of the other thin film transistors in the pixel circuit may be the same as that of the thin film transistor.

Exemplarily, as shown in FIG. 10, the organic light emitting display panel further includes a support post 500 between the quantum dot color filter substrate 100 and the blue backlight 200.

It should be noted that, FIG. 10 illustratively shows that a transparent film layer is arranged at a position of the blue sub-pixel B. In other embodiments, the transparent film layer may not be arranged at the position of the blue sub-pixel, as long as the film layer arrangement in the blue sub-pixel can realize that the light emitted from the blue backlight is blue light emitted at the position of the blue sub-pixel.

Figure 11:
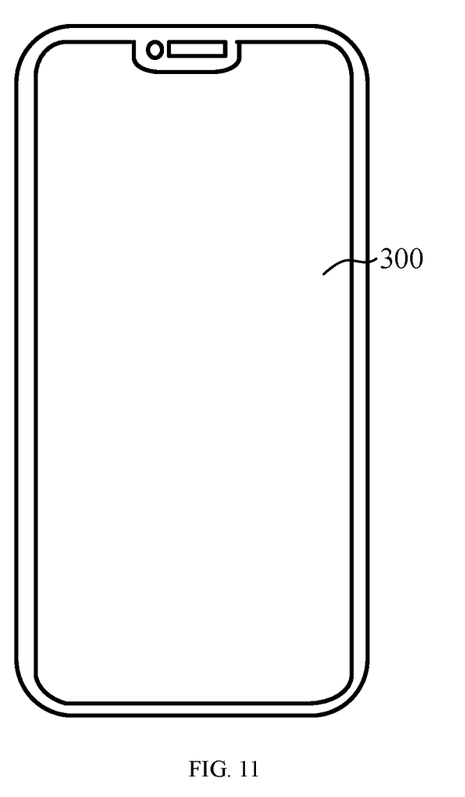
FIG. 11 is a schematic diagram of a display device according to an embodiment of the present disclosure.

The present disclosure further provides a display device. As shown in FIG. 11, FIG. 11 is a schematic diagram of a display device according to an embodiment of the present disclosure. The display device includes the display panel 300 described above. The display panel 300 includes the above quantum dot color filter substrate and a blue backlight. The display device shown in FIG. 11 is merely illustrative, and the display device may be any electronic device having a display function, such as a mobile phone, a tablet computer, a laptop computer, an electronic paper book, or a television.

What is claimed is:

1. A quantum dot color filter substrate, for use with a blue backlight, the quantum dot color filter substrate comprising:
    a plurality of pixel units arranged in an array;
    wherein the plurality of pixel units each comprises a blue sub-pixel, a red sub-pixel and a green sub-pixel, the red sub-pixel comprising a red quantum dot color filter, and the green sub-pixel comprising a green quantum dot color filter;
    an area ratio of the blue sub-pixel, the red sub-pixel, and the green sub-pixel is 1:X:Y, where $2.5 \leq X \leq 5$ and $4 \leq Y \leq 6$; and
    a contour of the blue sub-pixel comprises at least one arc protruding in a direction facing away from a center of the blue sub-pixel.

2. The quantum dot color filter substrate according to claim 1, wherein
    an angle θ of an arc satisfies $0 < \theta \leq 270°$.

3. The quantum dot color filter substrate according to claim 2, wherein
    the angle θ of the arc is 180° or 270°.

4. The quantum dot color filter substrate according to claim 1, wherein
    the contour of the blue sub-pixel further comprises a third line segment and a fourth line segment, the third line segment, the fourth line segment and the arc are connected head to tail to form an enclosed pattern.

5. The quantum dot color filter substrate according to claim 4, wherein
    the perimeter-to-area ratio N of the blue sub-pixel satisfies $$\frac{8\sqrt{2} + 6\sqrt{2}\pi}{4n + 3\pi n} \leq N < \frac{4\sqrt{2}}{n},$$

two endpoints of the arc are two endpoints of a first line segment, and a length of the first line segment is n.

6. The quantum dot color filter substrate according to claim 4, wherein
    an aspect ratio P of a minimum circumscribed rectangle of the blue sub-pixel satisfies $1 \leq P \leq 2$;

the minimum circumscribed rectangle of the blue sub-pixel comprises a first side, a second side, a third side, and a fourth side that are connected head to tail;

the third line segment and the fourth line segment of the blue sub-pixel coincide with the first side and the second side, respectively, and an intersection point of the third line segment and the fourth line segment coincides with an intersection point between the first side and the second side; and a length of the third line segment is less than or equal to a length of the first side, and a length of the fourth line segment is less than or equal to a length of the second side, and each of the third side and the fourth side is tangent to the arc of the blue sub-pixel.

7. The quantum dot color filter substrate according to claim 4, wherein each of the plurality of pixel units is in a shape of a rectangle comprising a fifth side, a sixth side, a seventh side, and an eighth side that are connected head to tail;

the third line segment and the fourth line segment of the blue sub-pixel coincide with the fifth side and the sixth side, respectively, and an intersection point of the third line segment and the fourth line segment coincides with an intersection point between the fifth side and the sixth side; and a length of the third line segment is less than or equal to a length of the fifth side, and a length of the fourth line segment is less than or equal to a length of the sixth side.

8. The quantum dot color filter substrate according to claim 7, wherein an aspect ratio Q of the rectangle satisfies $1 \leq Q \leq 1.5$.

9. The quantum dot color filter substrate according to claim 7, wherein a boundary between the red sub-pixel and the green sub-pixel is a second line segment, one end of the second line segment intersects with the seventh side, the other end of the second line segment intersects with the arc, an intersection point between the second line segment and the arc is a first intersection point which is a point of the arc other than two endpoints of the arc.

10. The quantum dot color filter substrate according to claim 9, wherein the first intersection point divides the arc into a first sub-arc and a second sub-arc, the first sub-arc is a boundary between the red sub-pixel and the blue sub-pixel; and the second sub-arc is a boundary between the green sub-pixel and the blue sub-pixel.

11. The quantum dot color filter substrate according to claim 1, wherein the blue sub-pixel has a circular shape or an elliptical shape.

12. The quantum dot color filter substrate according to claim 11, wherein a boundary between the red sub-pixel and the blue sub-pixel is an arc in the contour of the blue sub-pixel, and a boundary between the green sub-pixel and the blue sub-pixel is another arc in the contour of the blue sub-pixel.

13. The quantum dot color filter substrate according to claim 12, wherein the red sub-pixel and the blue sub-pixel are alternately arranged in a first direction, and the blue sub-pixel and the green sub-pixel are alternately arranged in a second direction intersecting with the first direction.

14. The quantum dot color filter substrate according to claim 13, wherein each of the red sub-pixel and the green sub-pixel is polygonal, and a number of sides of the green sub-pixel is larger than a number of sides of the red sub-pixel.

15. The quantum dot color filter substrate according to claim 1, further comprising a black matrix, the black matrix surrounding the blue sub-pixel, the red sub-pixel, and the green sub-pixel, respectively.

16. A display panel, comprising a quantum dot color filter substrate and a blue backlight, wherein the quantum dot color filter substrate is located at a light-emitting side of the blue backlight, and the quantum dot color filter substrate comprises:

a plurality of pixel units arranged in an array;

wherein the plurality of pixel units each comprises a blue sub-pixel, a red sub-pixel and a green sub-pixel, the red sub-pixel comprising a red quantum dot color filter, and the green sub-pixel comprising a green quantum dot color filter;

an area ratio of the blue sub-pixel, the red sub-pixel, and the green sub-pixel is 1:X:Y, where $2.5 \leq X \leq 5$ and $4 \leq Y \leq 6$; and a contour of the blue sub-pixel comprises at least one arc protruding in a direction facing away from a center of the blue sub-pixel.

17. A display device, comprising:

a display panel, the display panel having a quantum dot color filter substrate and a blue backlight, wherein the quantum dot color filter substrate is located at a light-emitting side of the blue backlight, and the quantum dot color filter substrate comprises:

a plurality of pixel units arranged in an array;

wherein the plurality of pixel units each comprises a blue sub-pixel, a red sub-pixel and a green sub-pixel, the red sub-pixel comprising a red quantum dot color filter, and the green sub-pixel comprising a green quantum dot color filter;

an area ratio of the blue sub-pixel, the red sub-pixel, and the green sub-pixel is 1:X:Y, where $2.5 \leq X \leq 5$ and $4 \leq Y \leq 6$; and a contour of the blue sub-pixel comprises at least one arc protruding in a direction facing away from a center of the blue sub-pixel.

* * * * *